United States Patent [19]
Kanamori et al.

[11] Patent Number: 5,863,822
[45] Date of Patent: Jan. 26, 1999

[54] METHOD OF MAKING NON-VOLATILE SEMICONDUCTOR MEMORY DEVICES HAVING LARGE CAPACITANCE BETWEEN FLOATING AND CONTROL GATES

[75] Inventors: Kohji Kanamori; Yosiaki Hisamune, both of Tokyo, Japan

[73] Assignee: NEC Corporation, Tokyo, Japan

[21] Appl. No.: 796,597

[22] Filed: Feb. 7, 1997

Related U.S. Application Data

[63] Continuation of Ser. No. 351,168, Nov. 30, 1994, abandoned.

[30] Foreign Application Priority Data

Dec. 1, 1993 [JP] Japan .................................. 5-301514

[51] Int. Cl.[6] .............................................. H01L 21/8247
[52] U.S. Cl. .......................................... 438/264; 438/981
[58] Field of Search ............. 437/43, 52; 148/DIG. 163; 257/316–317; 438/257, 263, 264, 981

[56] References Cited

U.S. PATENT DOCUMENTS

| | | |
|---|---|---|
| 4,688,078 | 8/1987 | Hseih ...................................... 257/317 |
| 5,081,055 | 1/1992 | Gill et al. .................................. 437/43 |
| 5,106,772 | 4/1992 | Lai ............................................. 437/43 |
| 5,352,619 | 10/1994 | Hong ......................................... 437/43 |
| 5,379,253 | 1/1995 | Bergemont .............................. 257/321 |
| 5,427,970 | 6/1995 | Hsue et al. .............................. 257/321 |
| 5,521,109 | 5/1996 | Hsue et al. ................................ 437/43 |

OTHER PUBLICATIONS

"A High Capacitive–Coupling Ratio (HiCR) Cell for 3V–only 64 MBIT and Future Flash Memories", Y. S. Hisamune et al., IEDM 1993, pp. 19–22.

"A Novel Sublithographic Tunnel Diode Based 5V–only Flash Memory", M. Gill et al., IEDM 1990, pp. 119–122.

*Primary Examiner*—Richard A. Booth
*Attorney, Agent, or Firm*—Foley, Hoag & Eliot, LLP

[57] ABSTRACT

Disclosed herein is a stacked gate type non-volatile semiconductor memory cell including source/drain regions having a first portion covered with a tunnel oxide film and a second portion covered with an insulator film. The memory cell further includes a gate insulating film formed on a channel region, wherein the tunnel insulating film is thinner than the gate oxide film and the insulator film is thicker than the gate insulating film. A floating gate is formed on the respective insulating films and a control gate is formed over the floating gate with an intervention of a second gate insulating film.

4 Claims, 7 Drawing Sheets

METHOD OF MAKING NON-VOLATILE SEMICONDUCTOR MEMORY DEVICES HAVING LARGE CAPACITANCE BETWEEN FLOATING AND CONTROL GATES

This application is a continuation of application Ser. No. 08/351,168, filed Nov. 30, 1994, now abandoned.

BACKGROUND OF THE INVENTION

The present invention relates to a non-volatile semiconductor memory device and, more particularly, to a non-volatile semiconductor memory element having floating and control gates.

In general, $E^2PROM$ (Electrically Erasable and programmable Read Only Memory) has been known as a non-volatile semiconductor memory element which can be programmable and erased electrically. One bit of an $E^2PROM$ is generally constituted with one select transistor and one memory cell transistor, and the memory cell transistor has floating and control gates.

Figure 22:
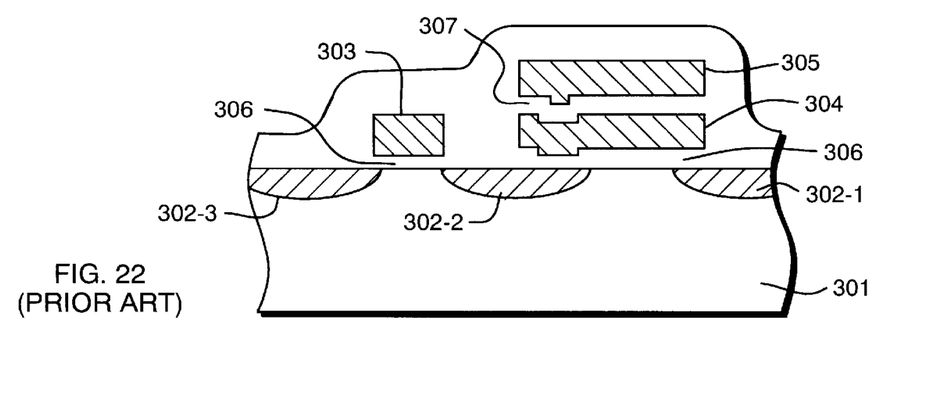
FIG. 22 is a cross sectional view illustrative of a conventional non-volatile semiconductor memory device.

Referring to FIG. 22, such a memory cell of the $E^2PROM$ is shown, in which a reference numeral 301 depicts a P-type silicon substrate, 302-1 to 302-3 an N-type impurity diffusion layer of a source/drain region, 303 a gate electrode of the select transistor, 304 a floating gate electrode of the memory cell transistor, 305 a control gate electrode of the memory cell transistor, 306 a tunnel insulating film formed between the floating gate electrode and the N-type impurity diffusion layer region 302, 306 a first gate insulating film between each of the gates 303 and 304 and the corresponding portion or channel portion of the substrate, and 307 a gate insulating film.

Programming of data into this memory cell is performed as follows: A high voltage such as 20V is applied to the control gate electrode 305 and the drain region 302-2 is grounded. At this time, an intense electric field is applied to the tunnel insulating film 306 by capacitive coupling among the diffusion layer 302-2, the floating gate 304 and the control gate 305, so electrons are injected from the diffusion layer 302-2 to the floating gate 304 by F-N (Fowler-Nordheim) tunneling to negatively charge the floating gate 304. A threshold voltage of the memory cell transistor is thereby pushed up to 7V or higher. The memory cell transistor thus programmed maintains an OFF state even when being supplied at the control gate 305 with a read voltage such as 5V.

In contrast, the control gate electrode 305 is grounded and a high voltage such as 20V is applied to the gate 303 of the select transistor and the drain region 302-2 in order to erase the data. In this case, an intense electric field is applied to the gate 303 of the select transistor and the drain region 302-2 in a reverse direction to that in the case of the programming operation, so that the electrons are discharged from the floating gate electrode 304 to the diffusion layer 302-2 by F-N tunneling to positively charge the floating gate 304. Thus, the memory cell transistor is changed to a depletion state to take the threshold voltage of -3V to -5V. Therefore, the memory transistor thus becomes conductive in response to the read voltage.

Since a relatively high voltage is needed to program and erase the memory transistor as described above, transistors which are used in peripheral circuits for data programming and erasing control circuits are required to have structures durable against such a high voltage. In general, such a high voltage durable transistor needs a large area.

It is therefore desirable to perform data programming and erasing operation with a lowered voltage.

SUMMARY OF THE INVENTION

An object of the present invention is thus to provide an improved non-volatile semiconductor memory device.

Another object of the present invention is to provide an $E^2PROM$ including a plurality of memory cells on which data programming and erasing operations are performed with a lowered voltage.

A memory device according to the present invention comprising a plurality of memory cells each having first and second regions of one conductivity type selectively formed in a semiconductor substrate of an opposite conductivity type apart from each other, to define a channel region therebetween, a first gate insulating film formed on the channel region and having a first thickness, a tunnel insulating film formed on a portion of the first region and having a second thickness smaller than the first thickness, an insulator film formed on a remaining portion of the first region and having a third thickness larger than that of the first gate insulating film, a floating gate formed on the first gate insulating film, the tunnel insulating film and the insulator film continuously thereover, a second gate insulating film formed on the floating gate, and a control gate formed on the second gate insulating film to cover the floating gate.

With such a structure as described above, the first capacitance between the floating gate and each of the first region and the substrate is lowered, whereas the second capacitance between the floating and control gates is enhanced. The capacitance ratio of the second capacitance to the first capacitance is thus made considerably high. Since the voltage actually applied to the floating gate in response to the programming and erasing voltages to the control gate is proportional to that capacitance ratio, the floating gate assumes a relatively high voltage due to the high capacitance ratio. Accordingly, the data programming and erasing operations are performed even when the voltage applied to the control gate is lowered. Transistors of peripheral circuits are thereby able to be formed so that they have a small area.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
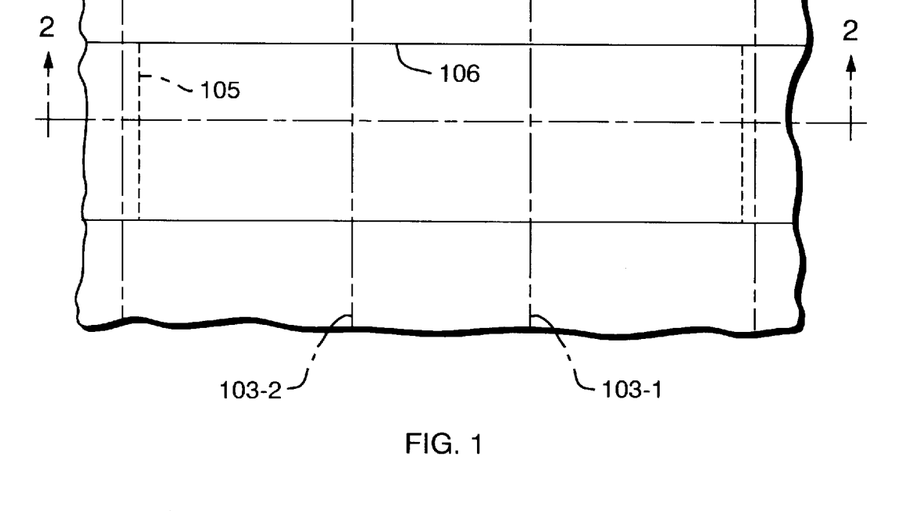
FIG. 1 is a plan view illustrative of one memory cell according to a first embodiment of the present invention.
Figure 2:
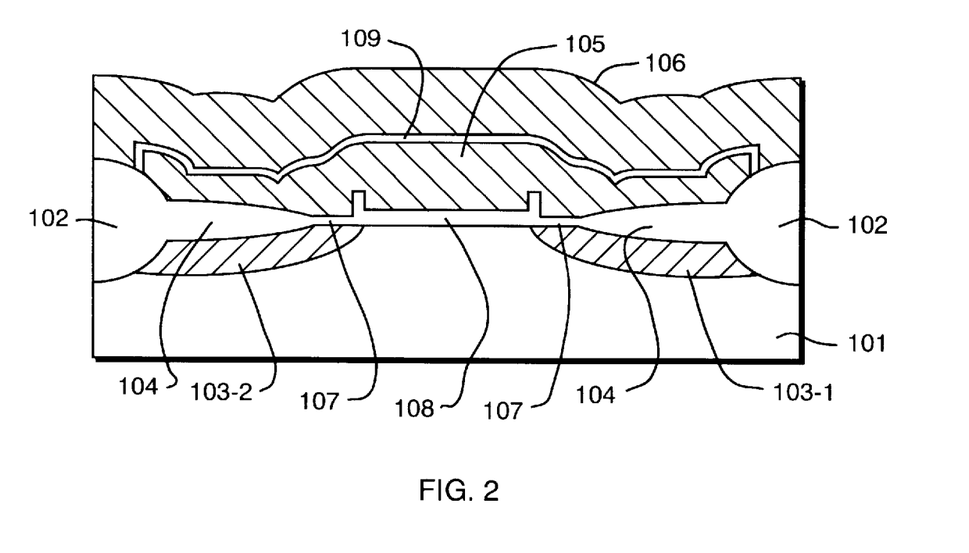
FIG. 2 is a cross sectional view along a line A-A' shown in FIG. 1.

Referring now to FIGS. 1 and 2, a non-volatile memory cell according to the first embodiment of the present invention is formed on a P-type semiconductor substrate 101 made of silicon. Selectively formed on and partially embedded in the substrate 101 is a field silicon dioxide layer 102 to define an active region in which memory cells are to be formed.

This memory cell further includes N-type first and second regions 103-1 and 103-2 as drain and source regions. As illustrated in FIG. 2, each of the regions 103 are selectively formed in the substrate 101 in contact with the field oxide layer 102 but apart from each other to define a channel region. A first gate silicon dioxide film 108 is formed on the channel region. While each of the regions 103 is also covered with an insulating film, the thickness of that insulating film is varied in accordance with the present invention.

More specifically, an end portion of each region 103 defining the channel region is covered with a tunnel insulating film 107. This film 107 is made of silicon oxynitride and has a thickness of 7.5 nm in this embodiment. The length of the end portion of each region 103 is designed to be smaller than 1.0 $\mu$m. On the other hand, the first gate oxide film 108 has a thickness of 20 nm. The remaining portion of each region 103 is covered with a silicon dioxide film 104 having a thickness of about 50–100 nm. As is apparent from FIG. 2, this oxide film 104 is partially embedded in the region 103, which will be further described later.

A floating gate electrode 105 made of poly-silicon is formed on the gate oxide film 108, the tunnel insulating film 107 and the oxide film 104 continuously thereover. The electrode 105 terminates on the field oxide film 102 in this embodiment. The floating gate 105 is then covered with a second gate insulating film 109. This film 109 has a so-called laminated structure of a silicon oxide film, a silicon nitride film and a silicon oxide film (i.e., ONO structure) and has a thickness of 13 nm in this embodiment. Formed on the second gate insulating film 109 is a control gate electrode 106 made of poly-silicon, a metal, or silicon/silicide. As is apparent from FIG. 1, the control gate 106 crosses the floating gate 105 with an intervention of the gate insulating 109.

In the memory cell thus constructed, there is a first capacitance between the floating gate 105 and each of the regions 103 and the substrate 101 and a second capacitance between the floating and control gates 105 and 106. The first capacitance is determined by the dielectric constants and thicknesses of the insulating films 108, 107 and 104. However, the film 104 has relatively large thickness and the end portion of each region 103 covered with the tunnel insulating film 107 is considerably small. As a result, the value of the first capacitance is made small.

On the other hand, the control gate 106 interfaces with the surfaces of the floating gate 105 including the top and side surfaces thereof, and hence the value of the second capacitance is considerably large. Accordingly, the ratio of the second capacitance to the first capacitance is made high. This means that the floating gate 105 receives an actual voltage which is slightly lower than the voltage applied to the control gate 106. As a result, the data programming and erasing operations are performed on this memory cell with a lowered voltage.

Figure 3:
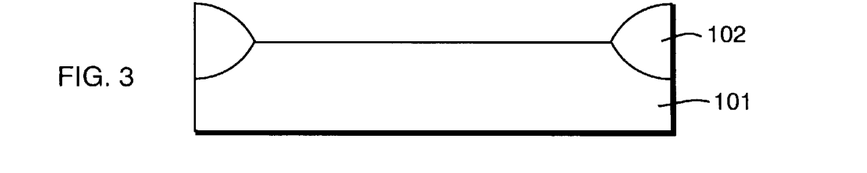
FIGS. 3 to 13 are cross sectional views illustrative of respective steps of a method for producing the memory cell shown in FIGS. 1 and 2.
Figure 4:
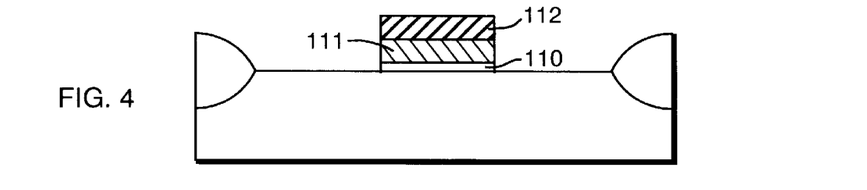

Turning to FIGS. 3 to 13, in a process for producing that memory cell, the silicon substrate 101 is first subjected to a selective oxidization technique to form the field silicon oxide film 102, as shown in FIG. 3.

The gate insulating film 110 is thereafter formed by, for example, thermal oxidation. A polysilicon layer 111 having a thickness of, for example, 200 nm is formed on the gate insulating film 110 by CVD and, then, a layer 112 including an oxide film layer having a thickness of, for example, 20 nm and a nitride film layer having a thickness of, for example, 100 nm is formed on the polysilicon layer 111. The gate insulating film 110, the polysilicon layer 111 and the layer 112 are patterned to form a part of a floating gate electrode and further to define a channel region in the substrate 101, as shown in FIG. 3.

Figure 5:
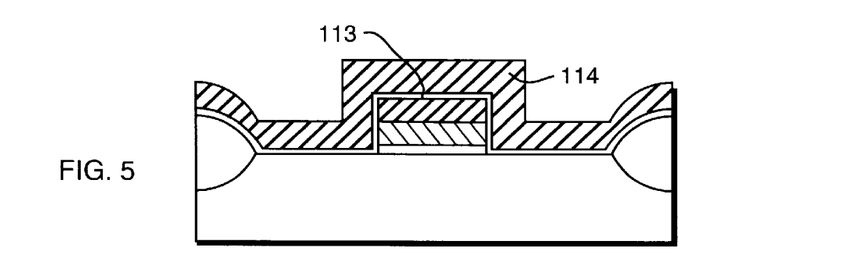
Figure 6:
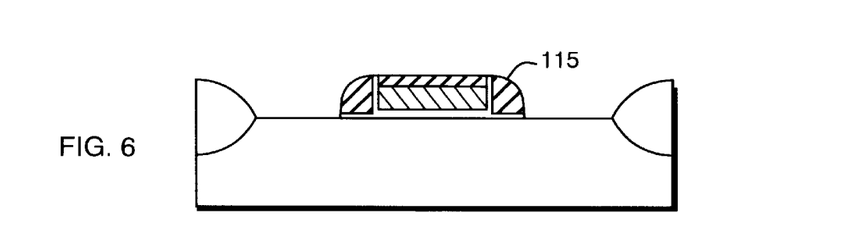

Thereafter, an oxide film 113 having thickness in the order of 20 nm and a nitride film 114 having thickness in the order of 80 nm are formed in the order on the whole surface of the substrate by CVD, as shown in FIG. 5 and a nitride film sidewall 115 is formed by etching the nitride film 114 back by anisotropic etching as shown in FIG. 6. In this case, the oxide film about 20 nm thick functions as a substrate protecting film during the etch-back of the nitride film 114. In this step, the side surface of the part of the floating gate is completely surrounded by the nitride film as the sidewall 115.

Figure 7:
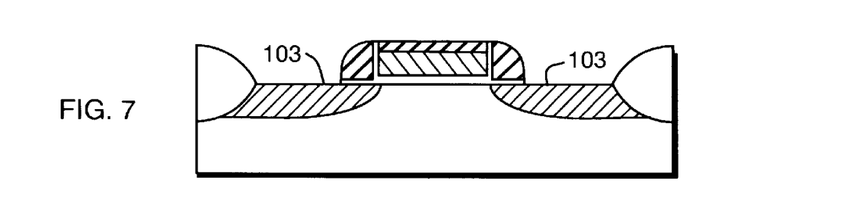

Then, the source and drain regions 103-1 and 103-2 of N-type are formed by ion-injecting N-type impurities such as arsenic by use of the nitride film as a mask at a dosing amount of $5\times10^{15}$ cm$^{-2}$ and with implanting energy of 70 KeV. The annealing is then carried out at 900° C. in nitrogen gas atmosphere to activate the implanted impurities, as shown in FIG. 7. In this case, the diffusion of impurities advance under a region of the substrate below the sidewall 115.

Figure 8:
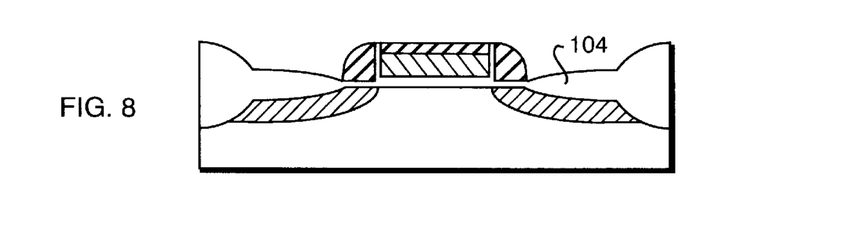

Then, an oxide film 104 having thickness of, for example, 100 nm is formed on the diffusion layer by thermal oxidation using the nitride films 112 and 115 as a mask, as shown in FIG. 8. During this thermal oxidation, the polysilicon layer 112 of the floating gate is not oxidized since it is covered by the nitride film 112.

Figure 9:
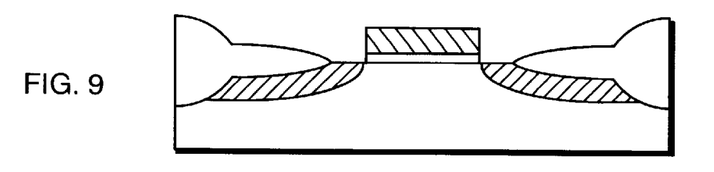

Thereafter, the nitride film sidewall 115 and then the thin etching stopper oxide film 113 covering the floating gate are removed by wet-etching to expose the region of the diffusion layer below the nitride film sidewall as shown in FIG. 9.

Figure 10:
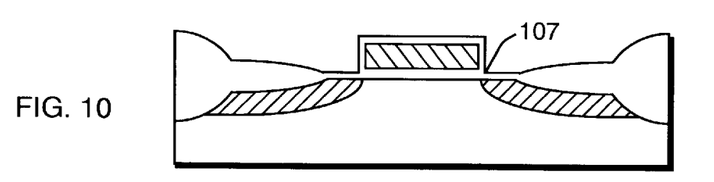
Figure 11:
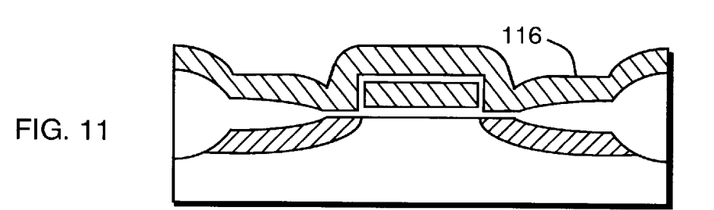

Then, a thin oxide film 107 having thickness of, for example, 8 nm is formed on the exposed surface of the diffusion layer and the polysilicon layer 111 by thermal oxidation as shown in FIG. 10 and a polysilicon layer 116 having thickness of, for example, 120 nm is formed the whole surface of the wafer by CVD as shown in FIG. 11.

Figure 12:
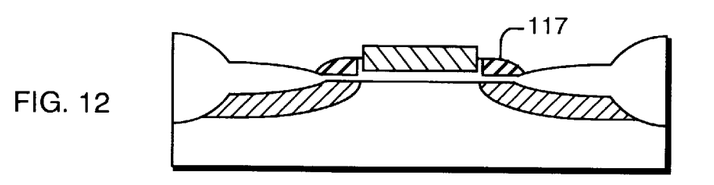

Then, a polysilicon sidewall 117 is formed by anisotropically etching back the polysilicon layer 116 such that the polysilicon sidewall 117 completely covers the thin oxide film region which is 8 nm thick on the diffusion layer, as shown in FIG. 12.

Finally, the oxide film formed on the floating gate is removed by wet-etching and then a polysilicon layer having thickness of, for example, 100 nm is formed by CVD, followed by patterning the latter polysilicon layer. As a result, a polysilicon layer 105 which is unified with the floating gate and the polysilicon sidewall 117 is formed as shown in FIG. 2.

Figure 13:
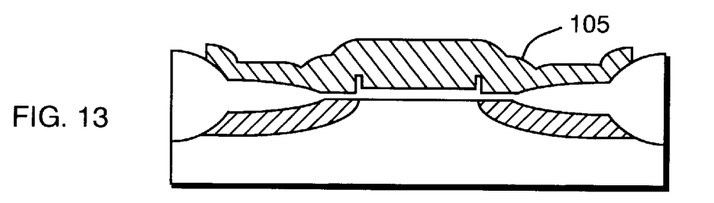

Then, the second gate insulating film 109 which is a three-layered ONO (oxide/nitride/oxide) film is formed thereon and then a control gate 106 of polysilicon is formed on the inter-layer insulating film 109 as shown in FIG. 13.

According to this embodiment, it is possible to set the capacitive coupling ratio at 0.7 to 0.9. In such case, write (discharge of electrons from the floating gate to the drain or source) voltage can be reduced to 6V to 10V and erase (injection of electrons from the drain/source to the floating gate) voltage can be reduced to 10V to 14V.

Figure 14:
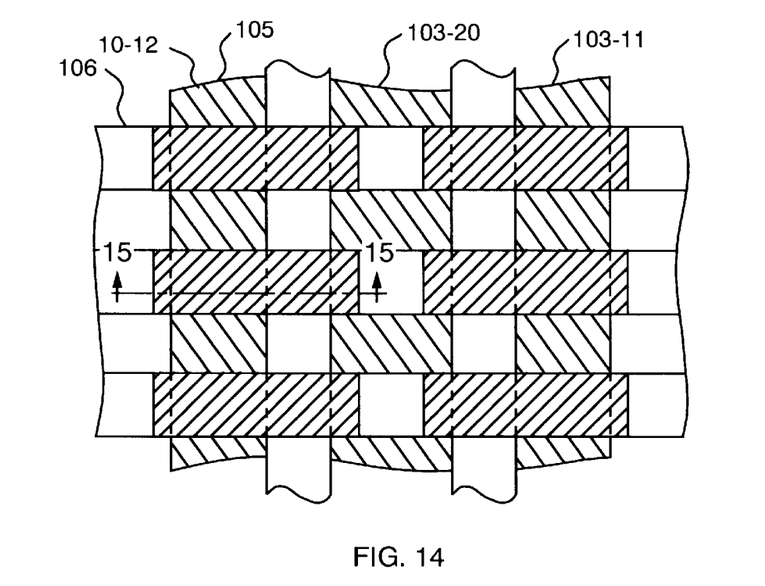
FIG. 14 is a plan view illustrative of a part of a memory device according to a second embodiment of the present invention.
Figure 15:
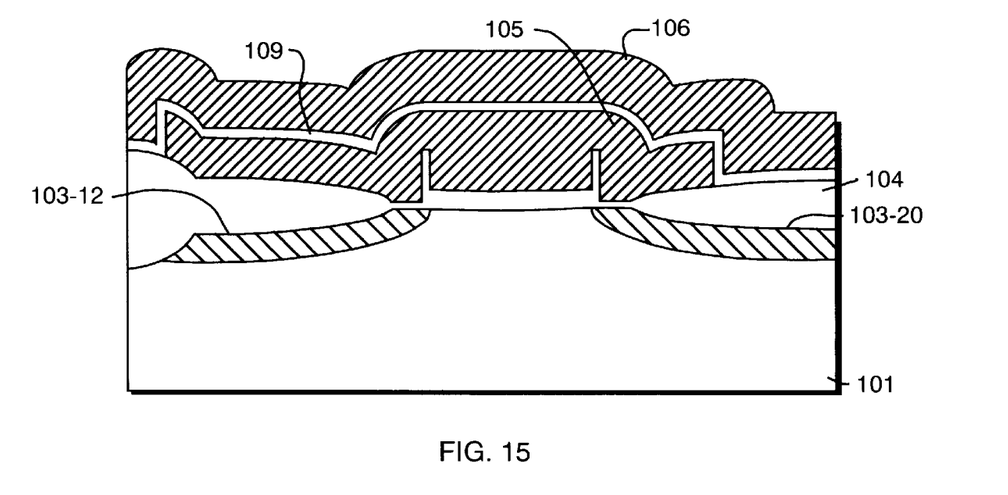
FIG. 15 is a cross sectional view along a line A-A' shown in FIG. 14.

Referring to FIGS. 14 and 15, there is shown a part of a memory cell array according to the second embodiment of the present invention, in which the same constituents as thoses shown in FIGS. 1 and 2 are denoted by the same reference numerals to omit further description thereof. In this memory, a plurality of memory cell transistors are arranged in a NOR type, and hence the sources of the cell transistors arranged in the adjacent two column lines are connected in common. Further, the drains of the cell transistors arranged in one of the adjacent two column lines are connected in common, and the drains of the cell transistors arranged in the other of them are connected in common. Accordingly, there are provided in FIG. 14 a common source line region 103-20 and two common drain line regions 103-11 and 103-12. Since the source line region 103-20 is used in common for the memory cell transistors, the floating gate 105 is terminated on the oxide film 104 covering the common source line region 103-20, as shown in FIG. 15. On the other hand, the control gate 106 is used in common for the cell transistors arranged in the same row.

Figure 16:
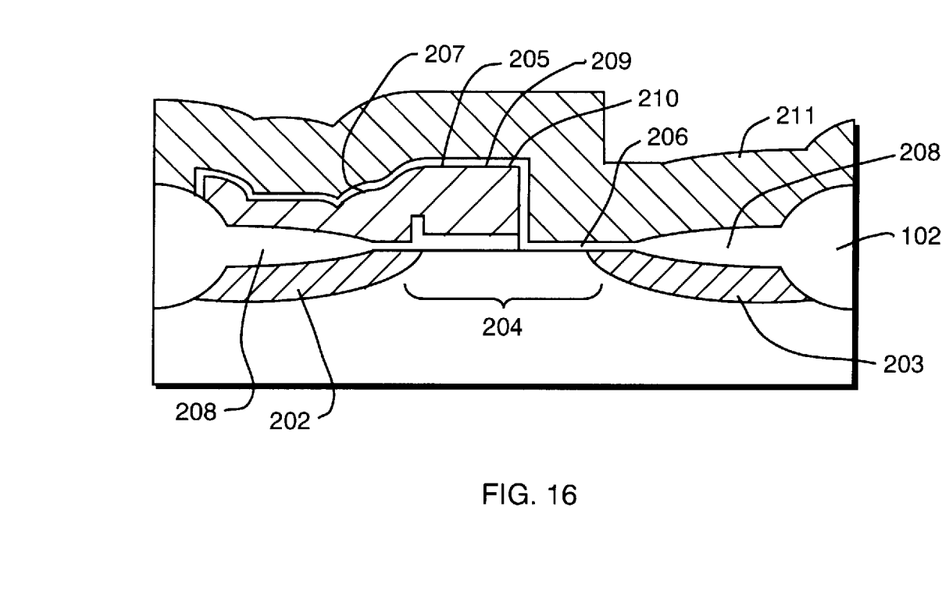
FIG. 16 is a cross sectional view illustrative of a memory cell according to a third embodiment of the present invention.

Turning to FIG. 16, a memory cell transistor according to the third embodiment of the present invention includes a P-type silicon substrate 201 containing boron at a density of $2\times10^{15}$ cm$^{-3}$. If desired, an N$^-$-type silicon substrate may be used in which case a P well having a surface density of $2\times10^{16}$ cm$^{-3}$ is formed in the N-type silicon substrate. An N-type drain region 202 and a source region 203 are formed selectively in the silicon substrate 201 or the P-type well of the N-type silicon substrate and a channel region 204 is formed between the drain and source regions 202 and 203.

A first gate insulating film 205 which may be of a silicon oxide film 15 nm thick is formed in a region of the surface of the silicon substrate 201 from a center portion of the channel region 204 to the drain region 202, a second gate insulating film 206 which may be a silicon oxide film 20 nm thick is formed in a region of the silicon substrate surface from the center portion of the channel region 204 to the source region 203 and a third gate film 207 which may be a silicon oxide or silicon nitride film 8 nm thick is formed in a portion of the drain region 202 on the side of the channel region 204. Further, an insulating film 208 which may be a silicon oxide film 80 nm thick is formed in the rest of the drain region 202 and the source region 203.

A floating gate electrode 209 is selectively formed through the first and third gate insulating films 205 and 207 and the insulating film 208 in the region from the center portion of the channel region 204 to the drain region 202 and a control gate electrode 211 is formed through the second gate film 206 and a fourth gate insulating film 210 which is formed on a surface of the floating gate electrode 209 and may have a triple layer structure of a silicon oxide film/silicon nitride film/silicon oxide film, having a silicon oxide film converted thickness of 20 nm thickness.

In this embodiment, the floating gate electrode 209 is formed on a half of the channel region 204 on the side of the drain region 202 and the control gate electrode 211 is formed on the surface of the silicon substrate 201 in the other half of the channel region 204 on the side of the source region 203 through the second gate film 206.

Figure 17:
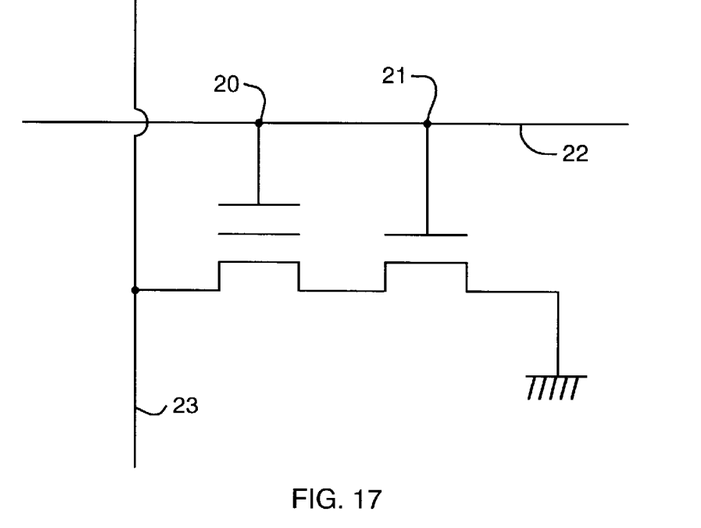
FIG. 17 is an equivalent circuit of the memory cell shown in FIG. 16.

Therefore, the semiconductor element in this embodiment can be considered as a parallel element having a stacked gate type non-volatile semiconductor memory element 20 including the first gate film 205, the floating gate electrode 209, the fourth gate film 207 and the control gate electrode 211 all of which are formed in the half of the channel region 204 on the side of the drain region 202 shown in FIG. 16 and a selecting transistor 21 which is arranged in parallel to the memory element 20 and comprises the second gate film 206 and the control gate electrode 211 which are formed in the other half of the channel region 204 on the side of the source region 203. FIG. 17 is an equivalent circuit of the parallel element connected to a word-line 22 and a bit-line 23.

In general, in the stacked gate type non-volatile memory element, there is a defect related to over-erasing of the memory element. That is, when electrons are discharged in excess from the floating gate of the stacked gate type non-volatile memory element by tunneling conduction through the insulating film adjacent to the floating gate electrode, the stacked gate type non-volatile memory element becomes depleted. Therefore, when a memory element array is constituted as an NOR type matrix of such memory elements, the memory element may be turned ON even if a word line is in a low voltage level corresponding to a non-select state, so that the memory element can not be selected during reading.

Since, however, the select transistor 21 is connected in parallel to the laminated gate type non-volatile memory element 20 in this embodiment, the select transistor 21 is kept in an OFF state as long as the word-line 22 is in a non-select state and, thus, the whole parallel element is in the OFF state.

Figure 18:
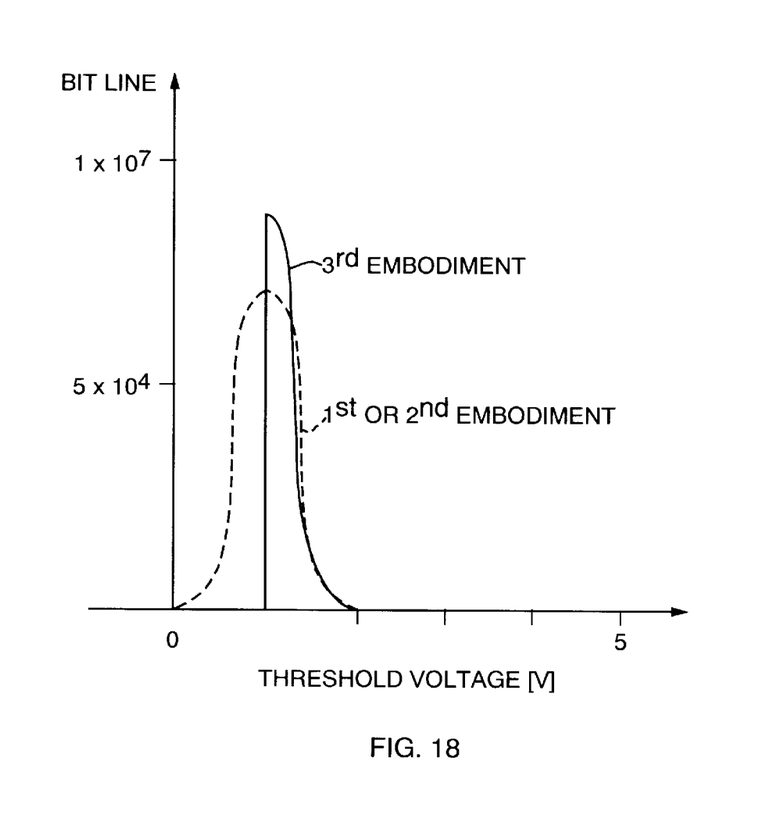
FIG. 18 is a graph indicative of distribution in threshold of the cell according to the first and third embodiments.

FIG. 18 shows a distribution of threshold voltage VT obtained for a hundred million memory elements after erasing by discharge of electrons from the floating gates thereof. In this case, the erasing condition was set such that an average VT after erasing becomes 1V. In FIG. 18, a solid curve corresponds to the memory element according to the third embodiment and a dotted curve corresponds to the memory element according to the first or second embodiment. For the memory elements of the second embodiment, the threshold voltage VT of about a half of the memory elements is within a range from 0 to 1 and a very small number of the memory elements become depleted. In the second embodiment, however, there is no memory element having a threshold voltage VT smaller than 1V. This fact means that, when the structure of the stacked gate type non-volatile memory element according to the second embodiment is used, it is possible to fabricate a non-volatile semiconductor memory device having memory capacity of in the order of a hundred million bits with high yield.

Figure 19:
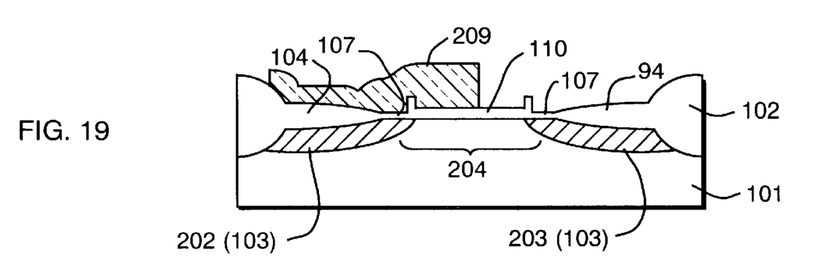
FIGS. 19 to 21 are cross sectional views illustrative of respective steps of a method for fabricating the memory cell shown in FIG. 16.
Figure 20:
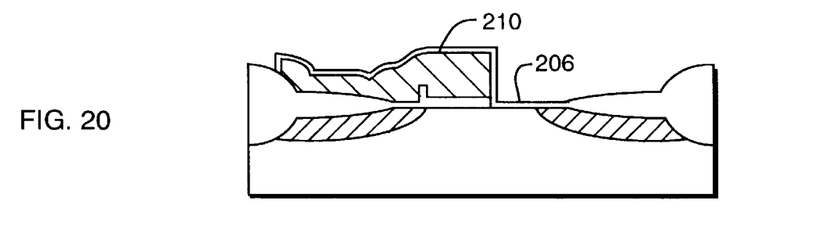
Figure 21:
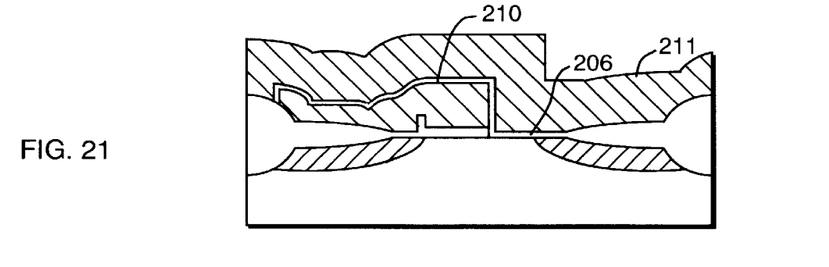

Now, a fabrication method of the memory element according to the second embodiment will be described with reference to FIGS. 19 to 21. FIG. 19 corresponds to FIG. 13 wherein half of the polysilicon film 105 prepared through the steps shown in FIGS. 3 to 12 is removed by patterning the region from the center portion of the channel region 204 to the drain region 202 to leave the other half as the floating gate electrode 209. Then, as shown in FIG. 20, portions of the insulating film 110 and the tunnel insulating film 107, which are not covered by the floating gate electrode 209, are removed by wet-etching with using buffered fluoric acid, and the second gate film 206 and a silicon oxide film 211*a* which result in the fourth gate film 210 are grown.

Thereafter, a polycide film which may have a double layer structure of a polysilicon film and a tungsten silicide film is grown as shown in FIG. 22 and a word-line is formed by patterning the control gate electrode 211. Although, in this embodiment, the second gate film 206 and the fourth gate film 210 are formed of the same material simultanesouly, they can be formed separately. For example, it is possible to form a three-layer structure of a silicon oxide/silicon nitride/silicon oxide film about 15 nm thick continuously in the step shown in FIG. 13 as a portion of the fourth gate film and thereafter to form the remaining portion of the fourth gate film and the second gate film on the side surfaces of the floating gate electrode by patterning and then thermally oxidizing the floating gate electrode.

As described above, according to the non-volatile semiconductor memory device and the fabrication method of the same of the present invention, the gate oxide films and the tunnel oxide film are formed separately in self-alignment and the capacitive coupling ratio is increased to 0.7 to 0.9.

Consequently, the write/erase voltage can be reduced. Further, due to the self-aligned separate formation of the gate oxide film and the tunnel oxide film, there is no increase in the number of photo-resists. In addition, since there is no need of high voltage transistors in the peripheral circuit, the fabrication process can be simplified.

What is claimed is:

1. A method of fabricating a semiconductor memory device, comprising:

forming source and drain regions defining a channel region therebetween, at least one part of said channel region being covered with a gate insulating film on which a first floating gate layer is formed, said gate insulating film having a first thickness, at least one of said source and drain regions having first and second surface portions, said first surface portion being covered with a first insulating layer having a second thickness which is larger than said first thickness;

exposing a surface of said first floating gate layer and said second surface portion;

covering the surface of said first floating gate layer and said second surface portion with a second insulating layer having a third thickness which is smaller than said first thickness;

forming a second floating gate layer on a portion of said second insulating layer covering said second surface portion;

forming a third floating gate layer in contact with said first floating gate layer, said second floating gate layer and said first insulating layer;

forming a third insulating layer on said third floating gate layer; and forming a control gate on said third gate insulating film.

2. The method as claimed in claim 1, wherein said forming of said second floating gate layer comprises:

forming a conductive layer over said first and second insulating layers, and etching back said conductive layer to leave a part of said conductive layer on the portion of said second insulating layer covering said second surface portion, said part of said conductive layer thereby defining said second floating gate layer.

3. The method as claimed in claim 1, wherein at least one of said source and drain regions is formed by using said first floating gate layer as at least a part of a mask.

4. The method as claimed in claim 1, wherein said first insulating layer is formed by using an anti-oxidizing insulating film formed over said second surface portion as a mask.

* * * * *